United States Patent
Wu et al.

(10) Patent No.: US 11,276,464 B2
(45) Date of Patent: *Mar. 15, 2022

(54) PROGRAMMING METHOD AND READING METHOD FOR MEMORY DEVICE

(71) Applicant: TAIWAN SEMICONDUCTOR MANUFACTURING CO., LTD., Hsinchu (TW)

(72) Inventors: Jau-Yi Wu, Hsinchu County (TW); Yu-Sheng Chen, Taoyuan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/078,910

(22) Filed: Oct. 23, 2020

(65) Prior Publication Data

US 2021/0043254 A1 Feb. 11, 2021

Related U.S. Application Data

(63) Continuation of application No. 16/406,897, filed on May 8, 2019, now Pat. No. 10,818,349.

(60) Provisional application No. 62/737,756, filed on Sep. 27, 2018.

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 13/0069* (2013.01)

(58) Field of Classification Search
CPC .............. G11C 13/004; G11C 13/0004; G11C 13/0069
See application file for complete search history.

(56) References Cited

U.S. PATENT DOCUMENTS

| | | | |
|---|---|---|---|
| 8,588,010 B2* | 11/2013 | Lee | G11C 11/5678 365/189.16 |
| 10,818,349 B2* | 10/2020 | Wu | G11C 13/003 |
| 2009/0303785 A1* | 12/2009 | Hwang | G11C 5/147 365/163 |
| 2010/0110785 A1* | 5/2010 | Chen | G11C 11/1673 365/171 |
| 2015/0206582 A1 | 7/2015 | Lam et al. | |
| 2015/0243352 A1 | 8/2015 | Park | |
| 2019/0096483 A1* | 3/2019 | Lee | G11C 13/003 |
| 2019/0164601 A1* | 5/2019 | Na | G11C 13/0004 |

(Continued)

*Primary Examiner* — Toan K Le
(74) *Attorney, Agent, or Firm* — Maschoff Brennan

(57) ABSTRACT

A method, includes: applying a read voltage at a first read voltage level to read a memory cell for detecting a resistance level of the memory cell; applying the read voltage at a second read voltage level, different from the first read voltage level, to read the memory cell for determining a waveform type has been utilized to program the memory cell; recognizing data bits stored in the memory cell. The data bits stored in the memory cell comprise a first data bit and at least one second data bit. The first data bit is recognized according to the waveform type and is irrelevant with the resistance level. The at least one second data bit is recognized according to the resistance level and is irrelevant with the waveform type. A device is also disclosed herein.

20 Claims, 12 Drawing Sheets

(56) References Cited

U.S. PATENT DOCUMENTS

2019/0391759 A1  12/2019  Kang et al.
2020/0051629 A1   2/2020  Baek et al.

\* cited by examiner

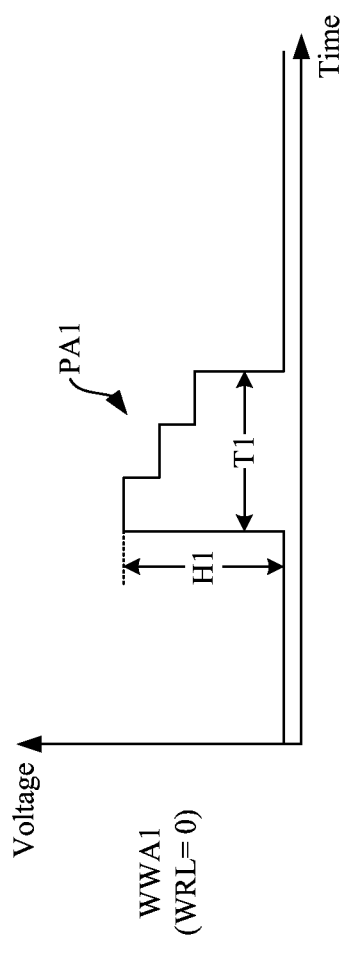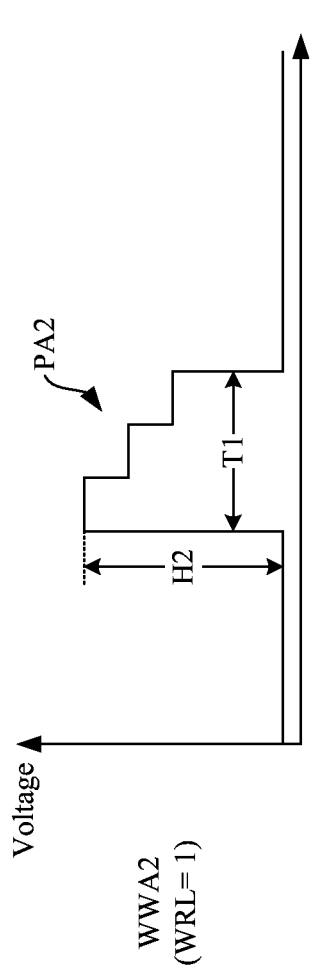

PROGRAMMING METHOD AND READING METHOD FOR MEMORY DEVICE

CROSS-REFERENCE TO RELATED APPLICATION

The present application is a continuation application of U.S. application Ser. No. 16/406,897, filed on May 8, 2019, now U.S. Pat. No. 10,818,349, issued Oct. 27, 2020, which claims priority benefit of U.S. Provisional Application Ser. No. 62/737,756, filed Sep. 27, 2018, the full disclosures of which are incorporated herein by reference.

BACKGROUND

Memory is an important component in a computer, and many different memory structures have been developed for different applications. For example, the memory structures include dynamic random access memory (DRAM), static random-access memory (SRAM), read-only memory (ROM), flash memory, phase-change memory (PCM), etc. Phase-change memory is a type of non-volatile random-access memory. The phase-change memory is a promising memory device, because memory cells of the phase-change memory have simple structures and also the phase-change memory can achieve a high data density by storing multiple data bits in one memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a waveform diagram illustrating a demonstrational example of a programming waveform in the first waveform type according to some embodiments of the present disclosure.

FIG. 5B is a waveform diagram illustrating a demonstrational example of another programming waveform in the first waveform type according to some embodiments of the present disclosure.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
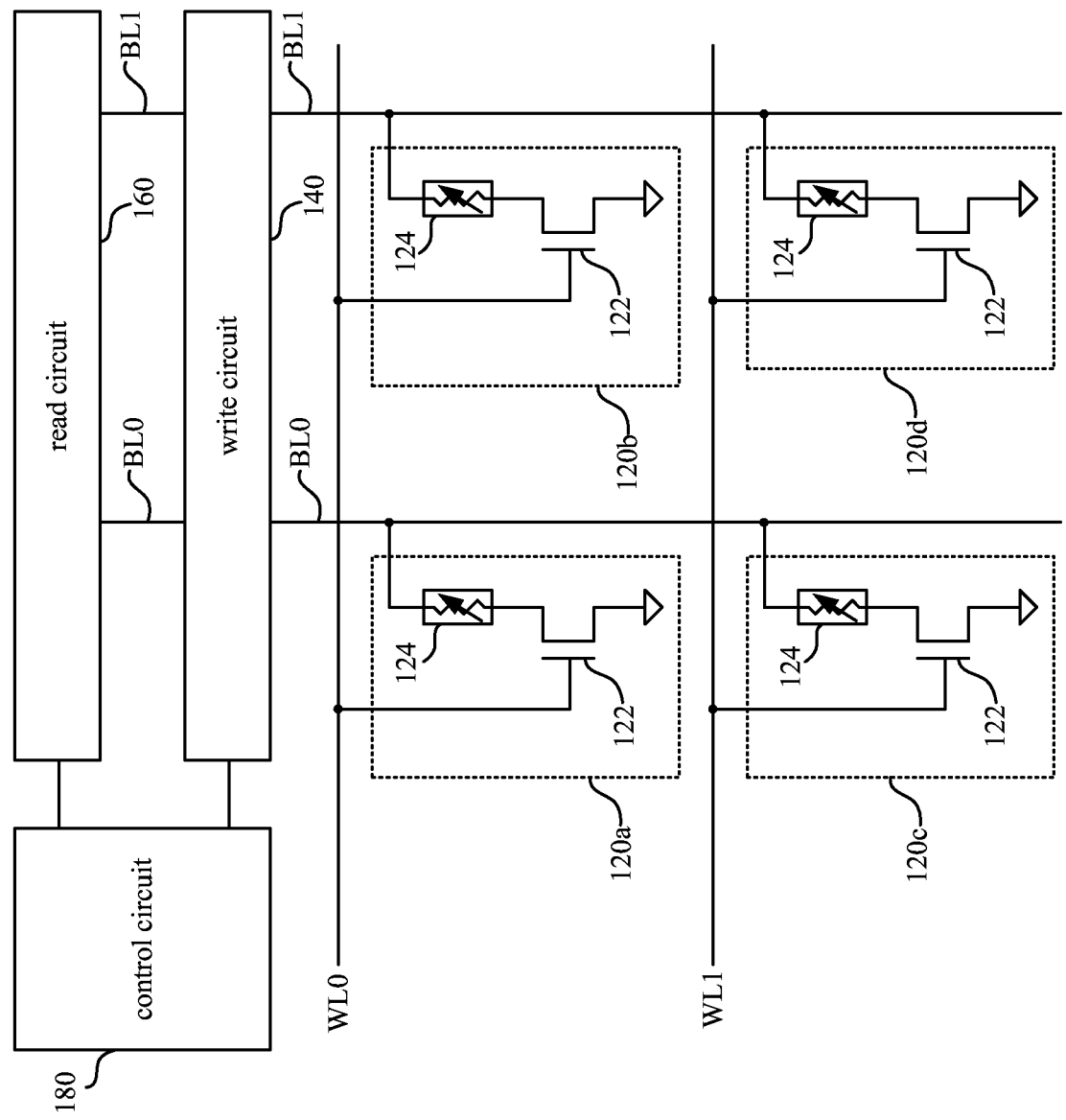
FIG. 1 is a schematic diagram illustrating a memory device according to some embodiments of the present disclosure.

FIG. 1 is a schematic diagram illustrating a memory device 100 according to some embodiments of the present disclosure. The memory device 100 includes a number of memory cells 120, a write circuit 140, a read circuit 160 and a control circuit 180.

In some embodiments, the memory device 100 includes a number of memory cells 120a-120d, and the memory cells 120 are arranged by columns and rows in a memory cell array (not shown in figures). For illustrative purposes, four memory cells 120a, 120b, 120c and 120d are arranged by two columns and two rows along two word lines WL0 and WL1 and two bit lines BL0 and BL1 as illustrated in FIG. 1. Various numbers of the memory cells are within the contemplated scope of the present disclosure.

As illustrated in FIG. 1, each of the memory cells 120a-120d includes a transistor 122 and a phase-change memory material 124. In some embodiments, a gate terminal of the transistor 122 is coupled to one of the word lines WL0/WL1. A source/drain terminal of the transistor 122 is coupled to one end of the phase-change memory material 124. Another source/drain terminal of the transistor 122 is coupled to a system ground. Another end of the phase-change memory material 124 is coupled to one of the bit lines BL0/BL1.

Each of the memory cells 120a-120d is able to be programmed or read through one corresponding word line WL0/WL1 and one corresponding bit line BL0/BL1. For example, the memory cell 120a is able to be programmed or read through the word line WL0 and the bit line BL0, and the memory cell 120b is able to be programmed or read through the word line WL0 and the bit line BL1. For illustrative purposes, the following paragraphs take the memory cell 120a for demonstration. In some embodiments, the memory cells 120b, 120c and 120d have structures and behaviors similar to the memory cell 120a.

In some embodiments, the phase-change memory material 124 of the memory cell 120a is able to be programmed into different resistance levels by a programming waveform generated by the write circuit 140 through the bit line BL0. The programming waveform is configured to change crystalline and amorphous states of the phase-change memory material 124, so as to program the phase-change memory material 124 to different resistance levels. In some embodiments, a resistance level retained in the phase-change memory material 124 is utilized to store data bits of the memory cells.

As illustrated in FIG. 1, the write circuit 140 is coupled with the bit lines BL0 and BL1 and utilized to provide the programming waveform for writing data bits into the memory cells 120a-120d. The read circuit 160 is coupled with the bit lines BL0 and BL1 and utilized to read the data bits stored in the memory cells 120a-120d. The control circuit 180 is coupled with the write circuit 140 and the read circuit 160. Based on the practical applications, such as the device 100 tends to program data into the memory cells 120a-120d or read data from the memory cells 120a-120d, the control circuit 180 generates a write command including write data to the write circuit 140 or generates a read command to the read circuit 140 to access the memory cells 120a-120d. In some embodiment, the control circuit 180 is implemented by a center processing unit (CPU), a processor, a control unit or an application-specific integrated circuit (ASIC). Details about programming and reading operations of the memory cells 120a-120d will be explained in following paragraphs.

Figure 2:
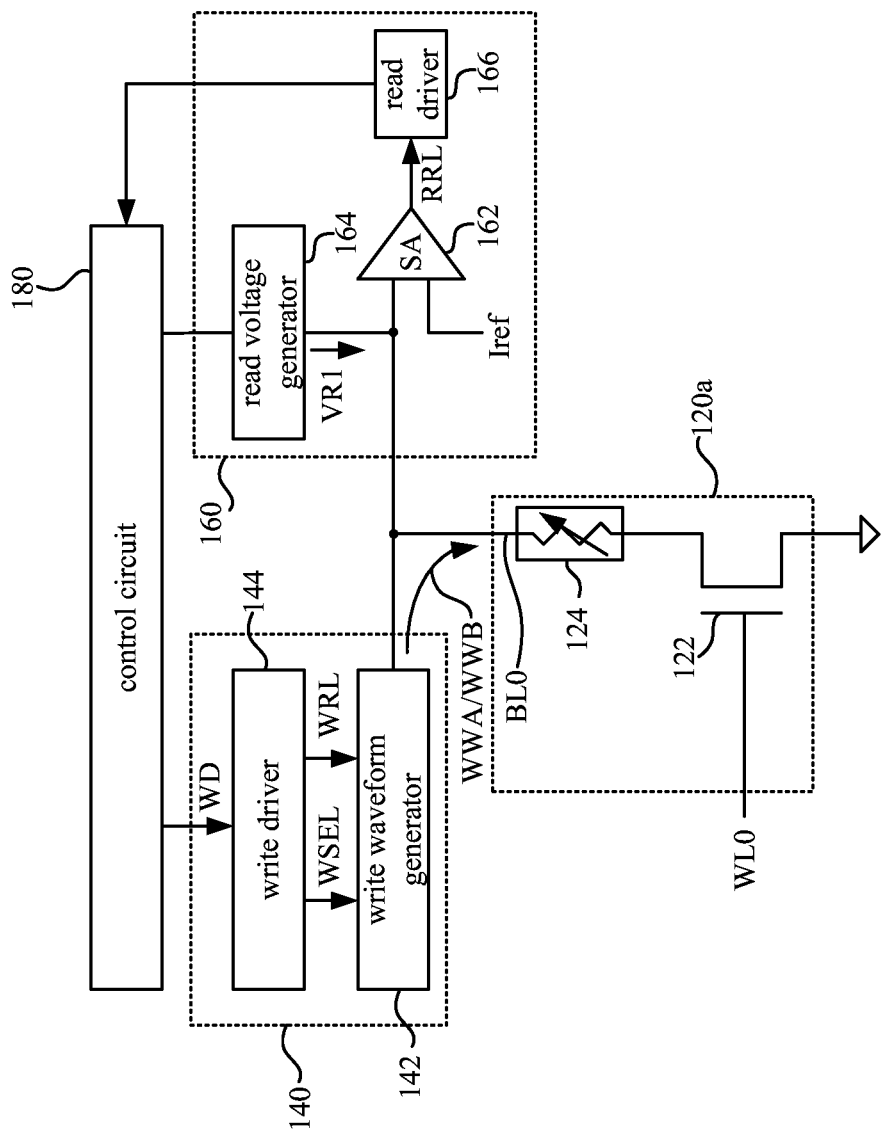
FIG. 2 is a schematic diagram illustrating the device related to programming operation to the memory cell in FIG. 1 according to some embodiments of the present disclosure.
Figure 3:
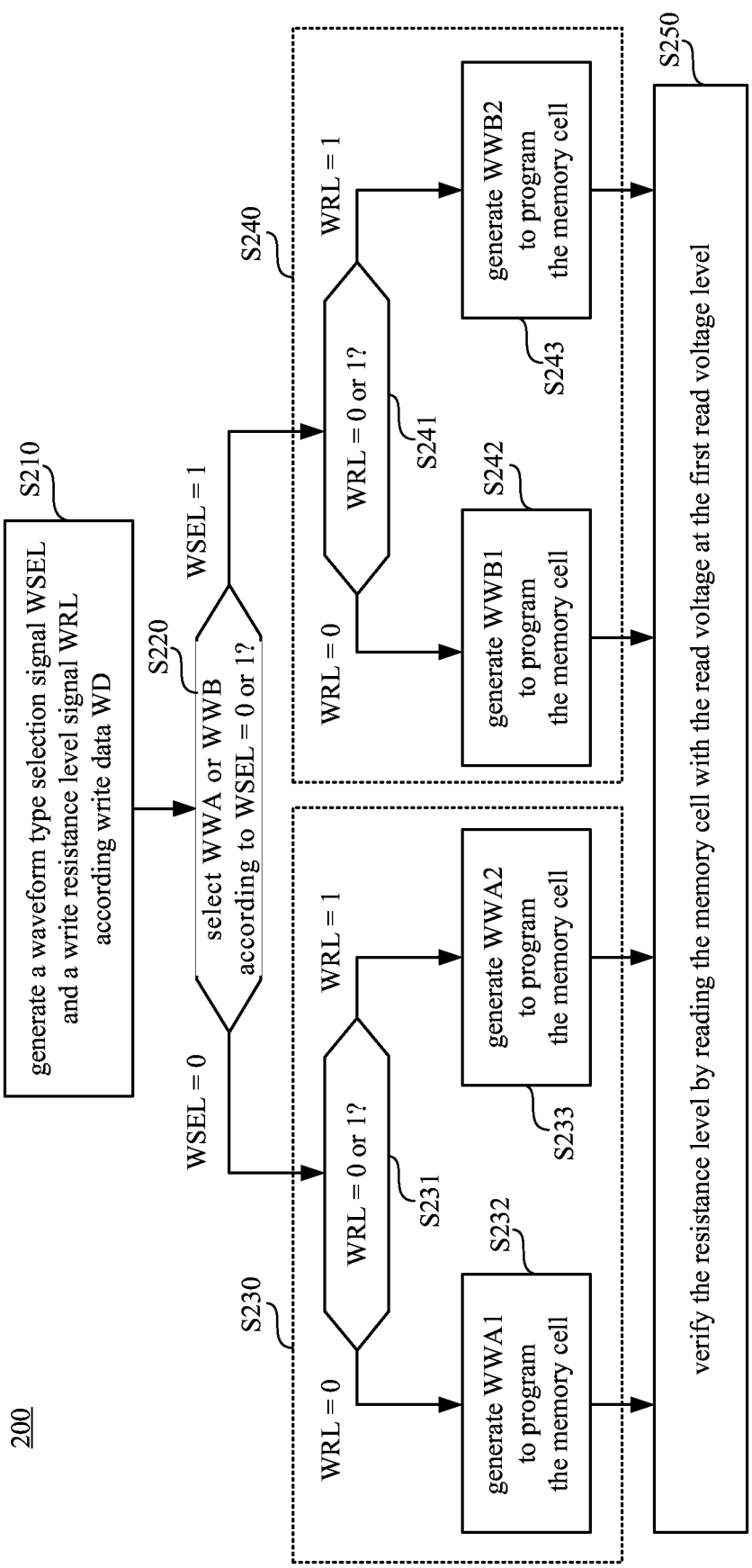
FIG. 3 is a flow diagram illustrating a method 200 for programming data into the memory cell in FIG. 2 according to some embodiments of the present disclosure.

Reference is further made to FIG. 2 and FIG. 3. FIG. 2 is a schematic diagram illustrating the device 100 related to programming operation to the memory cell 120a in FIG. 1 according to some embodiments of the present disclosure. With respect to the embodiments of FIG. 1, like elements in FIG. 2 are designated with the same reference numbers for ease of understanding. FIG. 3 is a flow diagram illustrating a method 200 for programming data into the memory cell 120a in FIG. 2 according to some embodiments of the present disclosure.

In some embodiments, the write circuit 140 illustrated in FIG. 2 includes a write waveform generator 142 and a write driver 144. The write driver 144 is coupled to the control circuit 180 and the write waveform generator 142. When the device 100 tends to store some data into the memory cell 120a, the control circuit 180 will send write data WD to the write driver 144. As illustrated in FIG. 2 and FIG. 3, operation S210 is performed, by the write driver 144, to generating a write resistance level signal WRL and a waveform type selection signal WSEL according to the write data WD received from the control circuit 180.

Figure 4A:
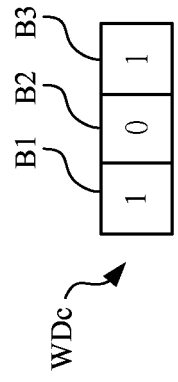
FIG. 4A is a schematic diagram illustrating an example of write data which includes two data bits according to some embodiments of the present disclosure.
Figure 4B:
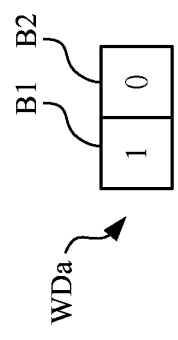
FIG. 4B is a schematic diagram illustrating another example of write data which includes two data bits according to some embodiments of the present disclosure.

In some embodiments, the write data WD may include multiple data bits to be programmed into the memory cell 120a. Reference is further made to FIG. 4A and FIG. 4B. FIG. 4A is a schematic diagram illustrating an example of write data WDa which includes two data bits B1-B2. FIG. 4B is a schematic diagram illustrating another example of write data WDb which includes two data bits B1-B2.

In some embodiments as illustrated in FIG. 4A and FIG. 4B, the write driver 144 will generate the write resistance level signal WRL and the waveform type selection signal WSEL according to the data bits B1 and B2 in the write data WDa/WDb. In some embodiments, the waveform type selection signal WSEL is generated according to the data bit B1 of the write data WDa/WDb, and the write resistance level signal WRL is generated according to the data bit B2 of the write data WDa/WDb.

In the embodiments illustrated in FIG. 4A, because the data bits B1 and B2 of the write data WDa are "10", the waveform type selection signal WSEL will be generated as "1" according to the data bit B1 of the write data WDa, and the write resistance level signal WRL will be generated as "0" according to the data bit B2 of the write data WDa.

On the other hand, in the embodiments illustrated in FIG. 4B, because the data bits B1 and B2 of the write data WDb are "01", the waveform type selection signal WSEL will be generated as "0" according to the data bit B1 of the write data WDb, and the write resistance level signal WRL will be generated as "1" according to the data bit B2 of the write data WDb. In some embodiments, the correspondence between the data bits B1/B2 relative to the waveform type selection signal WSEL and the write resistance level signal WRL can be interchanged. For example, the data bit B1 corresponds to the write resistance level signal WRL and the data bit B2 corresponds to the waveform type selection signal WSEL in some other embodiments.

Figure 4C:
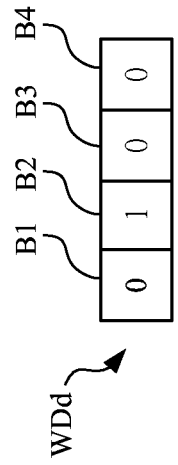
FIG. 4C is a schematic diagram illustrating an example of write data which includes three data bits according to some embodiments of the present disclosure.

In some embodiments, the write data may include more than two data bits. For example, when the device 100 is configured to store 3, 4 or more data bits in one singular memory cell 120a, the write data may include 3, 4 or more data bits. FIG. 4C is a schematic diagram illustrating another example of write data WDc which includes three data bits B1-B3. As illustrated in FIG. 4C, because the data bits B1-B3 of the write data WDc are "101", in some embodiments, the waveform type selection signal WSEL will be generated as "1" according to the data bit B1 of the write data WDc, and the write resistance level signal WRL will be generated as "01" according to the data bits B2 and B3 of the write data WDc.

Figure 4D:
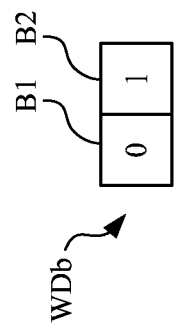
FIG. 4D is a schematic diagram illustrating an example of write data which includes four data bits according to some embodiments of the present disclosure.

FIG. 4D is a schematic diagram illustrating another example of write data WDd which includes four data bits B1-B4. As illustrated in FIG. 4D, because the data bits B1-B4 of the write data WDc are "0100", in some embodiments, the waveform type selection signal WSEL will be generated as "0" according to the data bit B1 of the write data WDd, and the write resistance level signal WRL will be generated as "100" according to the data bits B2-B4 of the write data WDd.

In some embodiments, the write data may include N+1 data bits. N is a positive integer equal to or larger than one. Embodiments illustrated in FIG. 4A and FIG. 4B demonstrate examples when N=1. Embodiments illustrated in FIG. 4C demonstrates an example when N=2. Embodiments illustrated in FIG. 4D demonstrates an example when N=3. The write resistance level signal WRL is generated according to N data bits of the N+1 data bits in the write data WDa-WDd. The write resistance level signal WRL is generated according to one data bit, other than the N data bits corresponding to the resistance level, of the N+1 data bits in the write data WDa-WDd.

As illustrated in FIG. 2 and FIG. 3, operation S220 is performed, by the write waveform generator 142, to select one between a first waveform type WWA and a second waveform type WWB based on whether the selection signal WSEL is equal to "0" or "1".

In response the selection signal WSEL being equal to "0", the first waveform type WWA is selected, operation S230 is performed, by the write waveform generator 142, to generate a programming waveform in the first waveform type WWA according to the write resistance level signal WRL.

In response the selection signal WSEL being equal to "1", the second waveform type WWB is selected, operation S240 is performed, by the write waveform generator 142, to generate a programming waveform in the second waveform type WWB according to the write resistance level signal WRL.

In other words, based on whether the selection signal WSEL is equal to "0" or "1", the write waveform generator 142 selectively generates the programming waveform in the first waveform type WWA or the second waveform type WWB. The waveform type of the programming waveform is determined by one data bit, such as the data bit B1, in the write data WDa-WDd as illustrated in FIG. 4A to FIG. 4D.

Figure 5C:
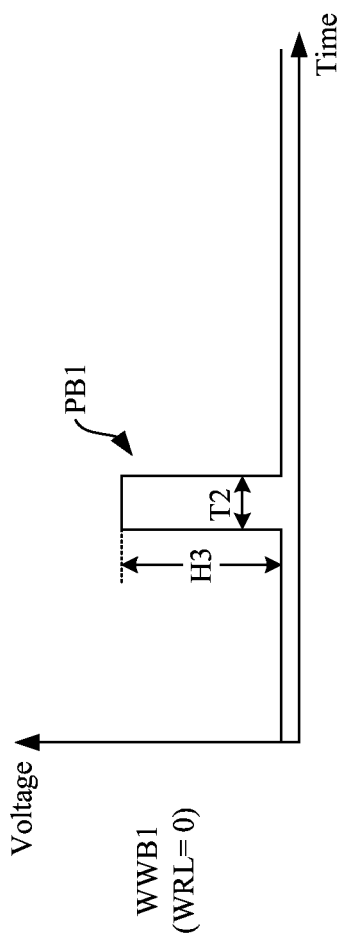
FIG. 5C is a waveform diagram illustrating a demonstrational example of a programming waveform in the second waveform type according to some embodiments of the present disclosure.
Figure 5D:
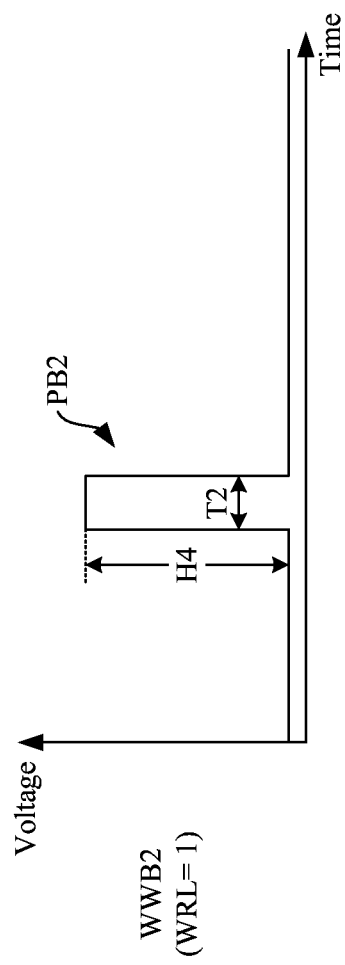
FIG. 5D is a waveform diagram illustrating a demonstrational example of another programming waveform in the second waveform type according to some embodiments of the present disclosure.

Reference are further made to FIG. 5A to FIG. 5D. FIG. 5A is a waveform diagram illustrating a demonstrational example of a programming waveform WWA1 in the first waveform type WWA. FIG. 5B is a waveform diagram illustrating a demonstrational example of another programming waveform WWA2 in the first waveform type WWA. FIG. 5C is a waveform diagram illustrating a demonstrational example of a programming waveform WWB1 in the second waveform type WWB. FIG. 5D is a waveform diagram illustrating a demonstrational example of another programming waveform WWB2 in the second waveform type WWB.

As illustrated in FIG. 5A to FIG. 5D, the programming waveforms WWA1 and WWA2 in the first waveform type WWA have waveform shapes different from the programming waveforms WWB1 and WWB2 in the second waveform type WWB.

As illustrated in FIG. 5A to FIG. 5D, in some embodiments, the programming waveform WWA1 in the first waveform type WWA has a pulse PA1 with pulse amplitude H1 and a persisting time duration T1. The programming waveform WWA2 in the first waveform type WWA has a pulse PA2 with pulse amplitude H2 and the persisting time duration T1. The programming waveform WWB1 in the second waveform type WWB has a pulse PB1 with pulse amplitude H3 and a persisting time duration T2. The programming waveform WWB2 in the second waveform type WWB has a pulse PB2 with pulse amplitude H4 and the persisting time duration T2. Both of the pulses PA1 and PA2 in the first waveform type WWA have the persisting time duration T1 longer than the persisting time duration T2 of the pulses PB1 and PB2 in the second waveform type WWB.

After the first waveform type WWA or the second waveform type WWB is selected in operation S220. The method 200 will further generates a programming waveform in the selected waveform type according to the write resistance level signal WRL. Pulse amplitude of the programming waveform will be decided according to the write resistance level signal WRL.

As illustrated in FIG. 3, in operation S230 when the first waveform type WWA is selected, operation S231 is performed, by the write waveform generator 142, to determine the write resistance level signal WRL equals to 0 or 1.

In some embodiments, in response to the write resistance level signal WRL equals to 0, operation S232 is performed, by the write waveform generator 142, to generate the programming waveform WWA1 in the first waveform type WWA, as illustrated in FIG. 5A, for programming the phase-change memory material 124.

In some embodiments, in response to the write resistance level signal WRL equals to 1, operation S233 is performed, by the write waveform generator 142, to generate the programming waveform WWA2 in the first waveform type WWA, as illustrated in FIG. 5B, for programming the phase-change memory material 124.

The programming waveform WWA1 in FIG. 5A with a lower pulse amplitude H1 will program the phase-change memory material 124 to a higher resistance level, such as about 1 MΩ in some embodiments. The programming waveform WWA2 in FIG. 5B with a higher pulse amplitude H2 will program the phase-change memory material 124 to a lower resistance level, such as about 100 KΩ in some embodiments.

As illustrated in FIG. 3, in operation S240 when the second waveform type WWB is selected, operation S241 is performed, by the write waveform generator 142, to determine the write resistance level signal WRL equals to 0 or 1.

In some embodiments, in response to the write resistance level signal WRL equals to 0, operation S242 is performed, by the write waveform generator 142, to generate the programming waveform WWB1 in the second waveform type WWB, as illustrated in FIG. 5C, for programming the phase-change memory material 124.

In some embodiments, in response to the write resistance level signal WRL equals to 1, operation S243 is performed, by the write waveform generator 142, to generate the programming waveform WWB2 in the second waveform type WWB, as illustrated in FIG. 5D, for programming the phase-change memory material 124.

The programming waveform WWB1 in FIG. 5C with a lower pulse amplitude H3 will program the phase-change memory material 124 to a higher resistance level, such as about 1 MΩ in some embodiments. The programming waveform WWB2 in FIG. 5D with a higher pulse amplitude H4 will program the phase-change memory material 124 to a lower resistance level, such as about 100 KΩ in some embodiments.

Figure 6A:
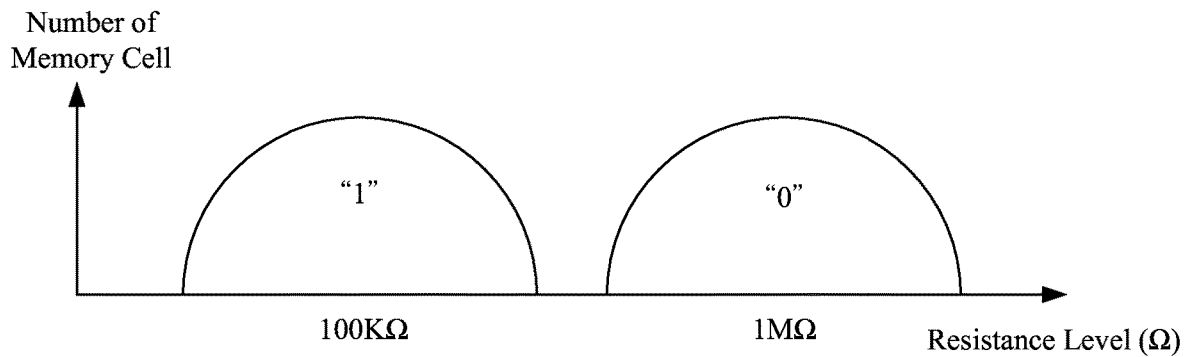
FIG. 6A is a schematic diagram illustrating a relationship between the resistance level of the phase-change memory material and a corresponding data bit stored by the phase-change memory material in some embodiments.

Reference is further made to FIG. 6A, which is a schematic diagram illustrating a relationship between the resistance level of the phase-change memory material 124 and a corresponding data bit stored by the phase-change memory material 124 in some embodiments. In the embodiments illustrated in FIG. 6A, the whole scale of the resistance level of the phase-change memory material 124 is divided into two resistance windows to store one bit, "0" around about 1 MΩ or "1" around about 100 KΩ, in the phase-change memory material 124. As illustrated in FIG. 4A and FIG. 4B, when the write data includes two data bits B1-B2, the resistance level of the phase-change memory material 124 in aforesaid programming operation is decided by the data bit B2 in some embodiments.

Figure 6B:
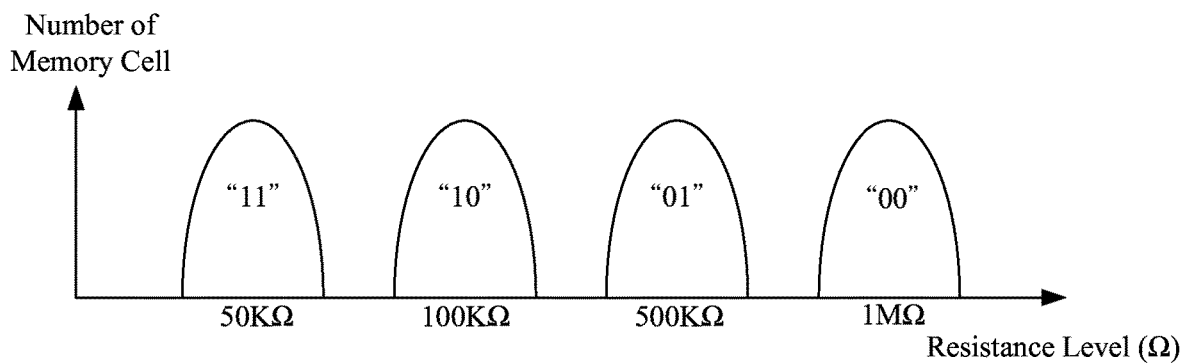
FIG. 6B is another schematic diagram illustrating a relationship between the resistance level of the phase-change memory material and a corresponding data bit stored by the phase-change memory material in some embodiments.

In some embodiments, the device 100 and the method 200 are not limited to store one bit by the resistance level of the phase-change memory material 124. Reference is further made to FIG. 6B, which is another schematic diagram illustrating a relationship between the resistance level of the phase-change memory material 124 and a corresponding data bit stored by the phase-change memory material 124 in some embodiments. In the embodiments illustrated in FIG. 6B, the whole scale of the resistance level of the phase-change memory material 124 is divided into four resistance windows to store two bits, "00" around 1 MΩ, "01" around 500 KΩ, "10" around 100 KΩ, or "11" around 50 KΩ, in the phase-change memory material 124. As illustrated in FIG. 4C, when the write data includes three data bits B1-B3, the resistance level of the phase-change memory material 124 in aforesaid programming operation is decided by the data bits B2-B3 in some embodiments.

Figure 6C:
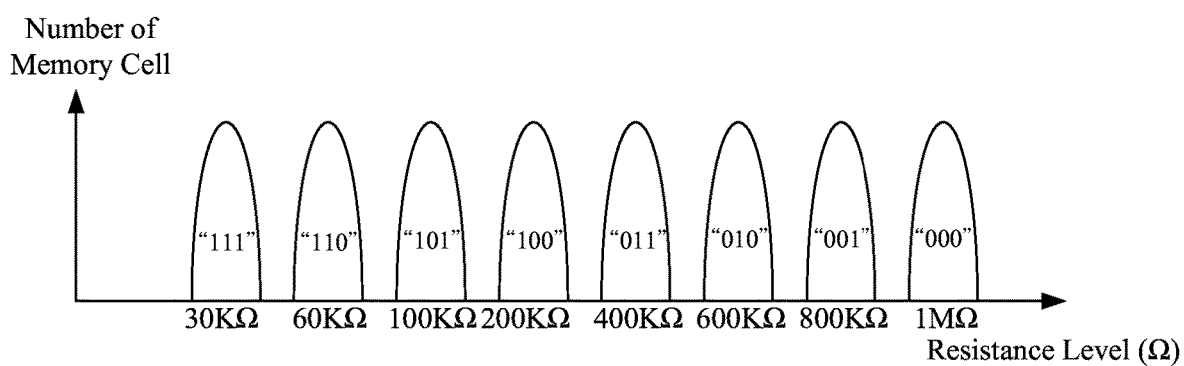
FIG. 6C is another schematic diagram illustrating a relationship between the resistance level of the phase-change memory material and a corresponding data bit stored by the phase-change memory material in some embodiments.

Reference is further made to FIG. 6C, which is another schematic diagram illustrating a relationship between the resistance level of the phase-change memory material 124 and a corresponding data bit stored by the phase-change memory material 124 in some embodiments. In the embodiments illustrated in FIG. 6C, the whole scale of the resistance level of the phase-change memory material 124 is divided into eight resistance windows to store three bits, "000" around 1 MΩ, "001" around 800 KΩ, "010" around 600 KΩ, "011" around 400 KΩ, "100" around 200 KΩ, "101" around 100 KΩ, "110" around 60 KΩ, "111" around 30 KΩ, in the phase-change memory material 124. As illustrated in FIG. 4D, when the write data includes four data bits B1-B4, the resistance level of the phase-change memory material 124 in aforesaid programming operation is decided by the data bits B2-B4 in some embodiments. As shown in embodiments in FIG. 6A to FIG. 6C, if the phase-change memory material 124 is utilized to store more data bits, a width of each resistance window will be narrower. For example, the width of the resistance window corresponding to data "000" in FIG. 6C is about ¼ of the width of the resistance window corresponding to data "0" in FIG. 6A. Programming more data bits into each phase-change memory material 124 needs precise programming control and is easy to fail.

After the phase-change memory material 124 is programmed by the programming waveform WWA1 in operation S232, S233, S242 or S243, operation S250 is performed by the read circuit 160 to verify a resistance level stored in the phase-change memory material 124, by reading the memory cell 120 with a read voltage with a first read voltage level, such as about 0.1V to about 0.3V in some embodiments. If the resistance level has not been programmed to the designated resistance level, the corresponding operation S232, S233, S242 or S243 will be repeated to program the phase-change memory material 124 again. Details about the reading operation will be discussed in following paraphrases.

Figure 7:
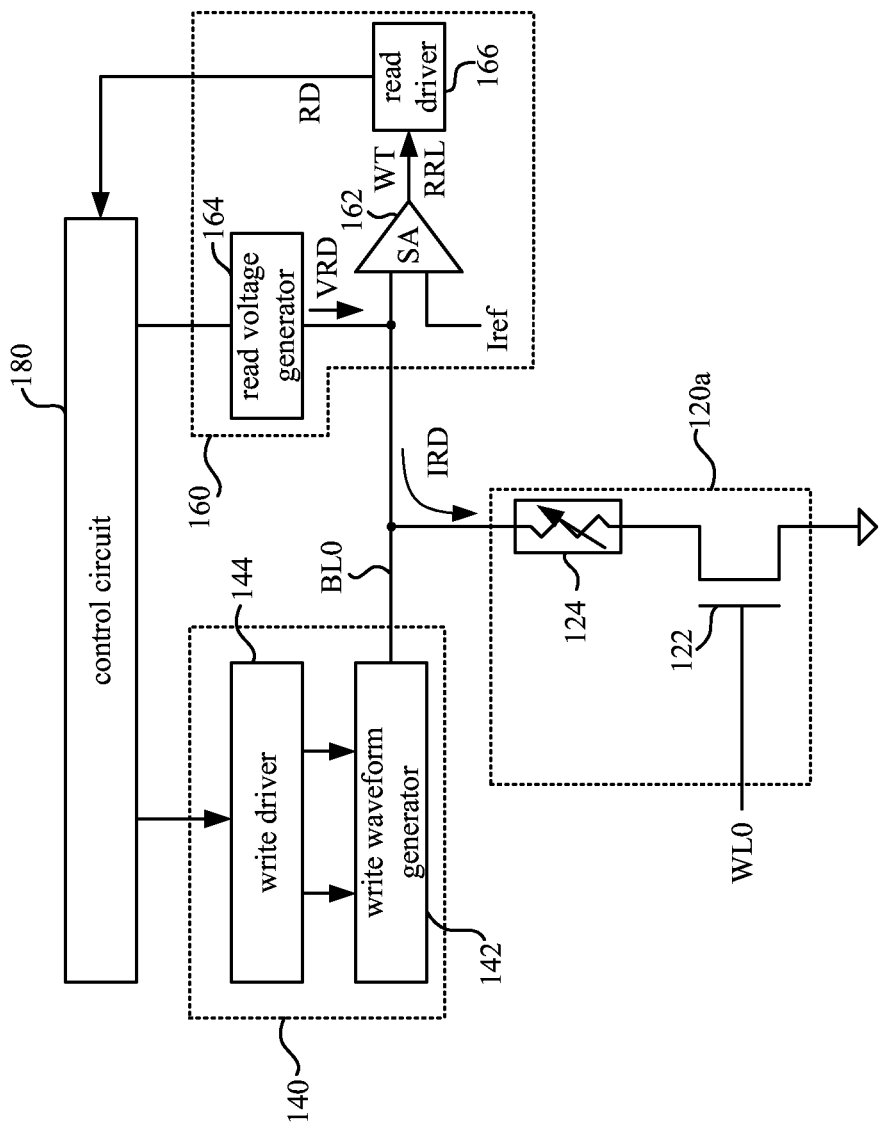
FIG. 7 is a schematic diagram illustrating the device related to reading operation to the memory cell in FIG. 1 according to some embodiments of the present disclosure.
Figure 8:
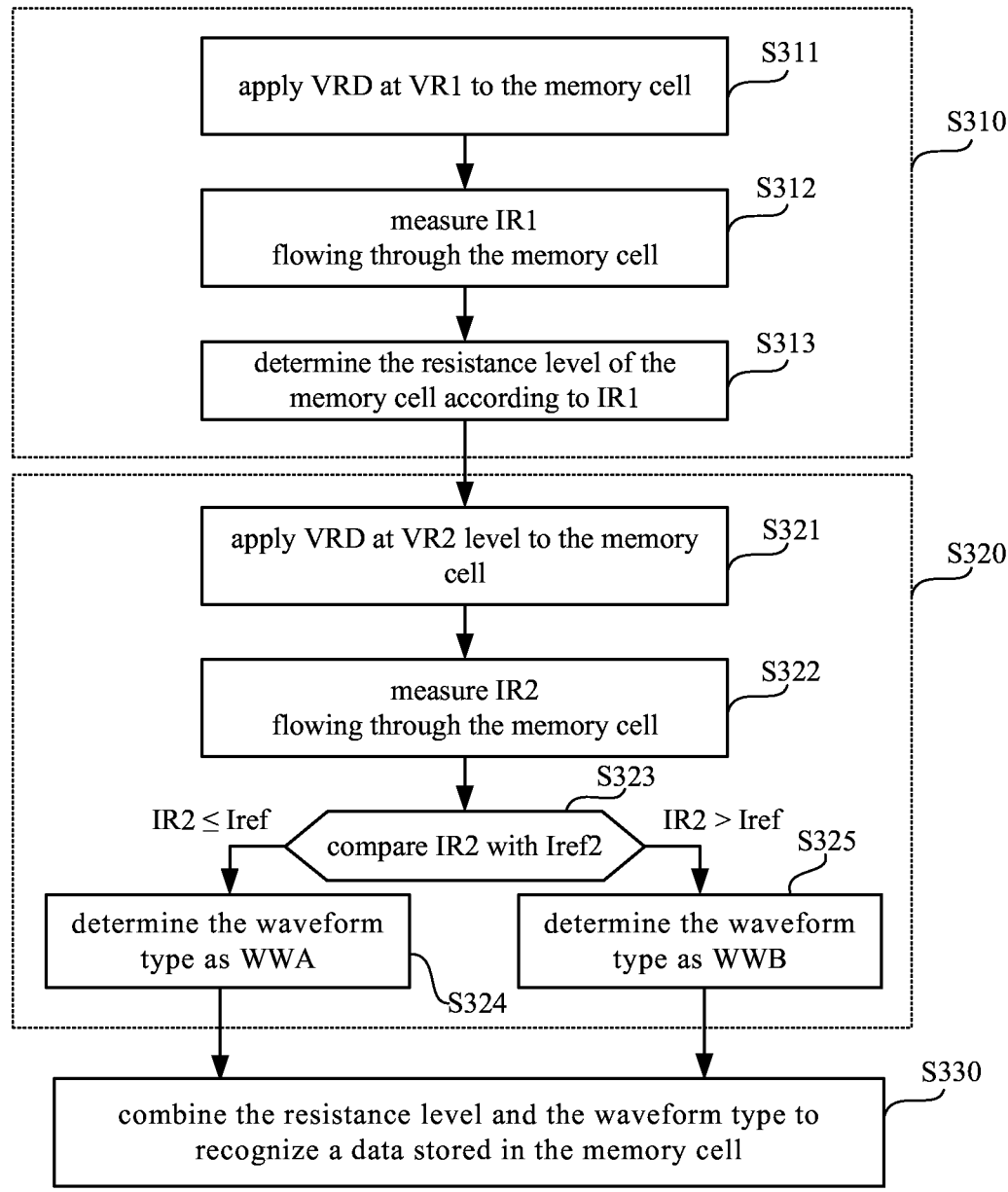
FIG. 8 is a flow diagram illustrating a method for reading data from the memory cell in FIG. 2 according to some embodiments of the present disclosure.

Reference is further made to FIG. 7 and FIG. 8. FIG. 7 is a schematic diagram illustrating the device 100 related to reading operation to the memory cell 120a in FIG. 1 according to some embodiments of the present disclosure. With respect to the embodiments of FIG. 1 and FIG. 2, like elements in FIG. 7 are designated with the same reference numbers for ease of understanding. FIG. 8 is a flow diagram illustrating a method 300 for reading data from the memory cell 120a in FIG. 2 according to some embodiments of the present disclosure.

As illustrated in FIG. 7, the read circuit 160 in some embodiments includes a sense amplifier 162, a read voltage generator 164 and a read driver 166. The read voltage generator is coupled with the phase-change memory material 124 of the memory cell 120a. The read voltage generator is configured to provide the read voltage VRD to the memory cell 120a. When the read voltage VRD is applied to the memory cell 120a, a read current IRD will be induced according to the read voltage VRD, the resistance level programmed in the phase-change memory material 124 and the crystalline and amorphous states of the phase-change memory material 124. The read current IRD flowing through the memory cell 120a is measured by the sense amplifier 162. In some embodiments, the sense amplifier 162 is configured to compare the read current IRD with a reference current Iref, and amplify a difference between the read current IRD with the reference current Iref. The read driver 166 is coupled to the sense amplifier 162. The read driver 166 is configured to determine data bits programmed in the memory cell 120a according to results of the sense amplifier 162.

The programming waveforms WWA1 and WWA2 in the first waveform type WWA as illustrated in FIG. 5A and FIG. 5B have ladder-shaped waveform with the wider persisting time duration T1. On the other hand, the programming waveforms WWB1 and WWB2 in the second waveform type WWB as illustrated in FIG. 5A have sharp convex waveforms with the shorter persisting time duration T2. The programming waveforms in different waveform types, such as the first waveform type WWA and the second waveform type WWB, will induce different crystalline and amorphous states on the phase-change memory material 124. In some embodiments, the difference between applying the first waveform type WWA and the second waveform type WWB can be distinguished by reading the memory cell 120a under different read voltage levels. Because the phase-change memory material 124 is not a typical variable resistor and the resistance level of the phase-change memory material 124 is dynamically affected by the crystalline and amorphous states of the phase-change memory material 124, it is observed that the resistance level of the phase-change memory material 124 measured under different read voltage levels might be different.

Figure 9:
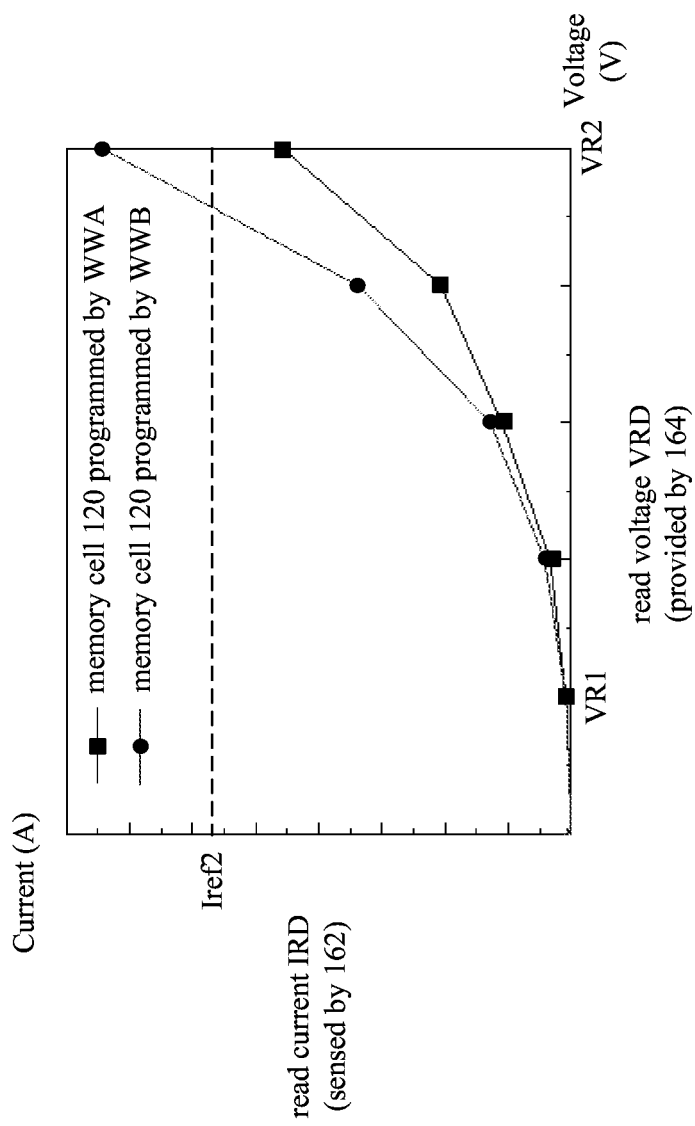
FIG. 9 is a schematic diagram illustrating a relationship between different read voltage levels of the read voltage and the read current in different conditions.

Reference is further made to FIG. 9, which is a schematic diagram illustrating a relationship between different read voltage levels of the read voltage VRD and the read current IRD in a condition that the memory cell 120a is programmed by the first waveform type WWA and in another condition that the memory cell 120a is programmed by the second waveform type WWB. The same pair of programming waveforms in the first waveform type WWA and the second waveform type WWB are utilized to illustrate the relationship shown in FIG. 9. As illustrated in FIG. 9, when the memory cell 120a is read by the read voltage VRD at a lower read voltage level VR1, such as about 0.1V to about 0.3V in some embodiments, the read currents through the memory cell 120a programmed by the first waveform type WWA and programmed by the second waveform type WWA will be similar to each other. In other words, this pair of programming waveforms in the first waveform type WWA and the second waveform type WWB are configured to program the memory cell 120a into the same resistance level under the first read voltage level, such as about 0.1V to about 0.3V. When the memory cell 120a is read by the read voltage VRD at a higher read voltage level VR2, such as about 0.5V to 1V, the read currents through the memory cell 120a programmed by the first waveform type WWA and programmed by the second waveform type WWB will be different from each other.

In other words, reading the memory cell 120a with the read voltage VRD at the first read voltage level VR1 is able to determine the resistance level of the memory cell 120a. Reading the memory cell 120a with the read voltage VRD at the second read voltage level VR2 is able to determine whether the memory cell 120a is programmed by a programming waveform in the first waveform type WWA or in the second waveform type WWB.

Figure 10A:
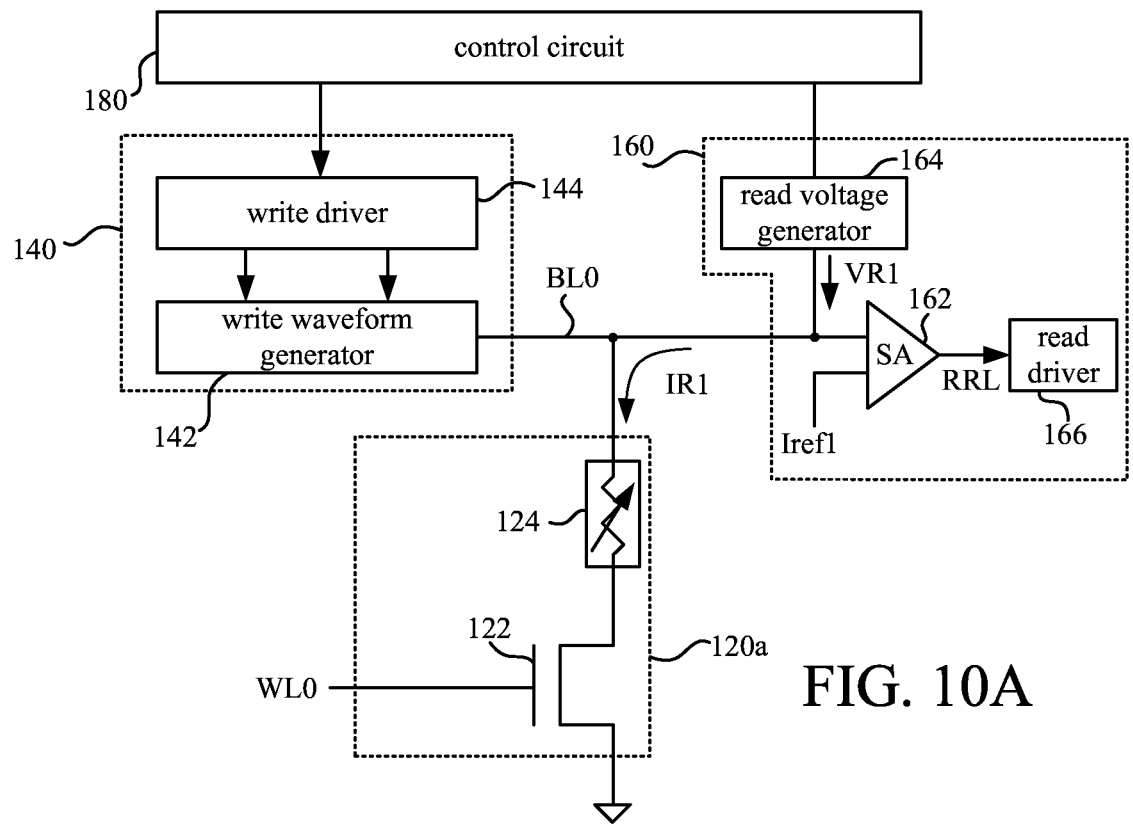
FIG. 10A is a schematic diagram illustrating behaviors of the read circuit in some embodiments.

As illustrated in FIG. 7 and FIG. 8, operation S310 is performed, by the read circuit 160, to apply the read voltage VRD at the first read voltage level VR1 to read the memory cell 120a for detecting the resistance level of the memory cell 120a. Reference is further made to FIG. 10A, which is a schematic diagram illustrating behaviors of the read circuit 160 during the operation S310 in FIG. 8 in some embodiments. With respect to the embodiments of FIG. 1, FIG. 2 and FIG. 7, like elements in FIG. 10A are designated with the same reference numbers for ease of understanding. As illustrated in FIG. 8 and FIG. 10A, operation S311 is performed, by the read voltage generator 164, to provide the read voltage VRD at the first read voltage level VR1, which is applied to the memory cell 120a.

As illustrated in FIG. 8 and FIG. 10A, operation S312 is performed, by the sense amplifier 162, to measure the read current IR1 flowing through the memory cell 120a. Operation S313 is performed, by the sense amplifier 162, to determine a read resistance level RRL of the memory cell 120a according to the read current IR1. In some embodiment, the sense amplifier 162 compares the read current IR1 with one (or more) reference current Iref1, so as to determine the read resistance level RRL of the memory cell 120a.

As illustrated in FIG. 9, when the read voltage VRD at the first read voltage level VR1, such as about 0.1V to about 0.3V, is applied to the memory cell 120a, the read current IRD, i.e., IR1 in FIG. 10A, of the memory cell 120a will not be affected by the waveform type utilized to program the memory cell 120a. In some embodiments, the operation S310 is able to distinguish the memory cell 120a is programmed by the programming waveform WWA1 in FIG. 5A or the programming waveform WWA2 in FIG. 5B. However, the operation S310 is not able to distinguish the memory cell 120a is programmed by the programming waveform WWA1 in FIG. 5A or the programming waveform WWB1 in FIG. 6A. In other words, if the original write data has two data bits B1 and B2 as illustrated in FIG. 4A or FIG. 4B programmed into the memory cell 120a. The operation S310 is able to distinguish the data bit B2, corresponding to the write resistance level signal WRL, and not able to distinguish the data bit B1, corresponding to the waveform type selection signal WSEL.

In some embodiments, for example, when the memory cell 120a applied the relationship shown in FIG. 6A, the whole scale of the resistance level of the phase-change memory material 124 is divided into two resistance windows to store one bit, "0" around about 1 MΩ or "1" around about 100 KΩ, the reference current Iref1 is configured around a center point to separate 1 MΩ and 100 KΩ under the first read voltage level VR1. In some embodiments, for example, when the memory cell 120a applied the relationship shown in FIG. 6B, the whole scale of the resistance level of the phase-change memory material 124 is divided into four resistance windows to store one bit, "0" around about 1 MΩ or "1" around about 100 KΩ, three reference currents Iref1 are configured around center points to separate 1 MΩ/500 KΩ, 500 KΩ/100 KΩ and 100 KΩ/50 KΩ, under the first read voltage level VR1.

Figure 10B:
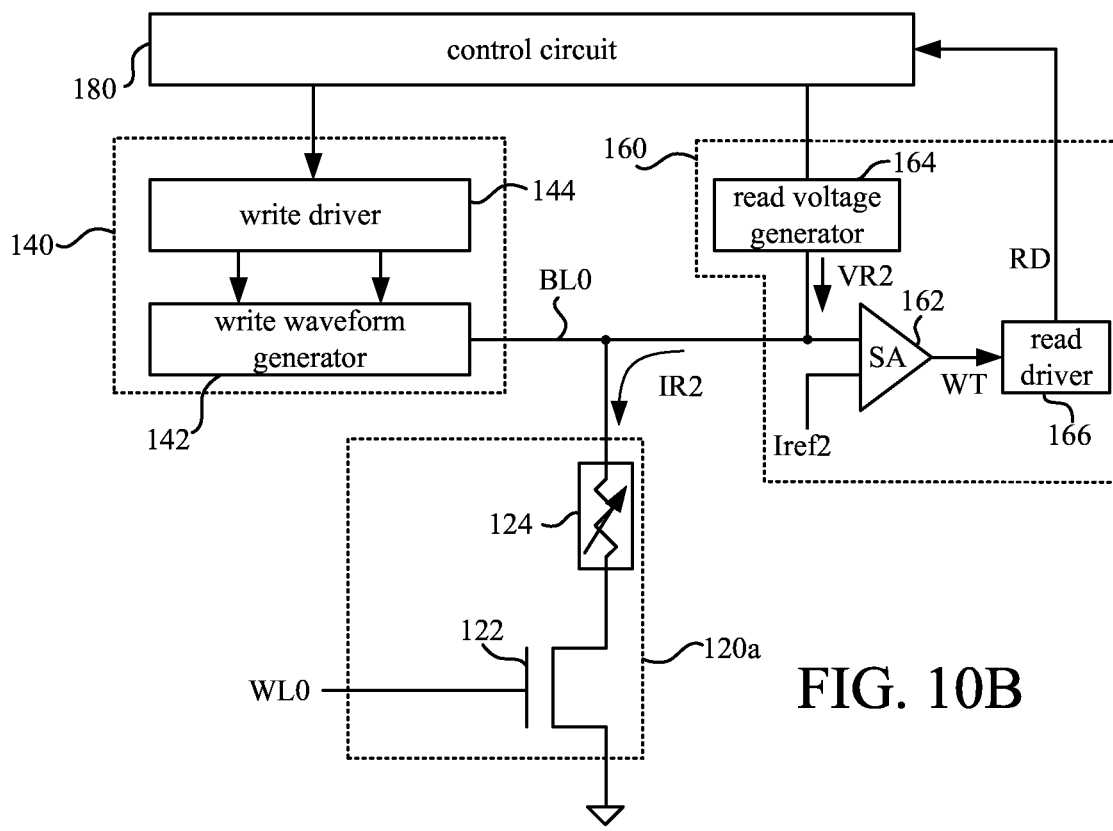
FIG. 10B is a schematic diagram illustrating behaviors of the read circuit in some embodiments.

As illustrated in FIG. 7 and FIG. 8, operation S320 is performed, by the read circuit 160, to apply the read voltage VRD at the second read voltage level VR2 to read the memory cell 120a, so as to determine the waveform type, such as the first waveform type WWA or the second waveform type WWB, has been utilized to program the memory cell 120a. Reference is further made to FIG. 10B, which is a schematic diagram illustrating behaviors of the read circuit 160 during the operation S320 in FIG. 8 in some embodiments. With respect to the embodiments of FIG. 1, FIG. 2 and FIG. 7, like elements in FIG. 10B are designated with the same reference numbers for ease of understanding. As illustrated in FIG. 8 and FIG. 10B, operation S321 is performed, by the read voltage generator 164, to provide the read voltage VRD at the second read voltage level VR2, which is applied to the memory cell 120a.

As illustrated in FIG. 8 and FIG. 10B, operation S322 is performed, by the sense amplifier 162, to measure a read current IR2 flowing through the memory cell 120a. Operation S323 is performed, by the sense amplifier 162, to compare the read current IR2 with a reference current Iref2, so as to determine whether the memory cell 120a is programed by a programming waveform in the first waveform type WWA or in the second waveform type WWB. As illustrated in FIG. 9, the reference current Iref2 is configured around a center level to separate the first waveform type WWA or in the second waveform type WWB.

In response to the read current IR2 is lower than the reference current Iref2, operation S324 is performed, by the sense amplifier 162, to determine the waveform type has been utilized to program the memory cell 120a as the first waveform type WWA. In some embodiments, the sense amplifier 162 generate a waveform type signal WT as "0" indicating the first waveform type WWA has been utilized to program the memory cell 120a.

In response to the read current IR2 exceeds the reference current Iref2, operation S325 is performed, by the sense amplifier 162, to determine the waveform type has been utilized to program the memory cell 120a as the second waveform type WWB. In some embodiments, the sense amplifier 162 generate a waveform type signal WT as "1" indicating the second waveform type WWB has been utilized to program the memory cell 120a.

As illustrated in FIG. 9, when the read voltage VRD at the second read voltage level VR2, such as about 0.5V to about 1V, is applied to the memory cell 120a, the read current IRD, i.e., the IR2 in FIG. 10B, of the memory cell 120a will be dominated by the waveform type utilized to program the memory cell 120a. In some embodiments, the operation S320 is able to distinguish the memory cell 120a is programmed by the programming waveform WWA1 in FIG. 5A or the programming waveform WWB1 in FIG. 5C. In other words, if the original write data has two data bits B1 and B2 as illustrated in FIG. 4A or FIG. 4B programmed into the memory cell 120a. The operation S320 is able to distinguish the data bit B1, corresponding to the waveform type signal WT.

As illustrated in FIG. 7 and FIG. 8, operation S330 is performed, by the read driver 166 of the read circuit 160, to combine the read resistance level RRL and the waveform type signal WT to recognize the data bits stored in the memory cell 120a.

Figure 11A:
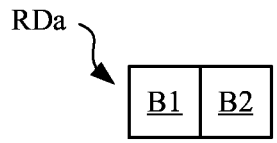
FIG. 11A is a schematic diagram illustrating an example of read data which includes two data bits according to some embodiments of the present disclosure.

Reference is further made to FIG. 11A, which is a schematic diagram illustrating an example of read data RDa which includes two data bits B1-B2. In some embodiments, the data bit B2 of the read data RDa is recognized according to the read resistance level RRL, and the data bit B1 of the read data RDa is recognized according to the waveform type signal WT. In some embodiments, the correspondence between the data bits B1/B2 relative to the waveform type signal WT and the read resistance level signal RRL can be interchanged. For example, the data bit B1 corresponds to the read resistance level signal RRL and the data bit B2 corresponds to the waveform type signal WT in some other embodiments.

Figure 11B:
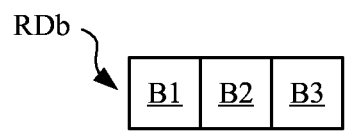
FIG. 11B is a schematic diagram illustrating an example of read data which includes three data bits according to some embodiments of the present disclosure.

FIG. 11B is a schematic diagram illustrating another example of read data RDb which includes three data bits B1-B3. As illustrated in FIG. 11B, in some embodiment, the data bit B1 of the read data RDb can be determined according to the waveform type signal WT, and the data bits B2-B3 of the read data RDb can be determined according to the read resistance level signal RRL.

Figure 11C:
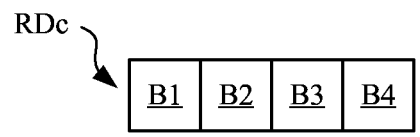
FIG. 11C is a schematic diagram illustrating an example of read data which includes four data bits according to some embodiments of the present disclosure.

FIG. 11C is a schematic diagram illustrating another example of read data RDc which includes four data bits B1-B4. As illustrated in FIG. 11C, in some embodiment, the data bit B1 of the read data RDc can be determined according to the waveform type signal WT, and the data bits B2-B4 of the read data RDc can be determined according to the read resistance level signal RRL.

In some embodiments, a method is disclosed. The method includes: applying a read voltage at a first read voltage level to read a memory cell for detecting a resistance level of the memory cell; applying the read voltage at a second read voltage level, different from the first read voltage level, to read the memory cell for determining a waveform type has been utilized to program the memory cell; recognizing data bits stored in the memory cell. The data bits stored in the memory cell comprise a first data bit and at least one second data bit. The first data bit is recognized according to the waveform type and is irrelevant with the resistance level. The at least one second data bit is recognized according to the resistance level and is irrelevant with the waveform type.

Also disclosed is a method including: selecting, in response to a selection signal that is associated with write data, a waveform type from waveform types; selecting, in response to a level signal that is associated with the write data, a resistance level from resistance levels; programming data bits into a memory cell according to the waveform type being selected and the resistance level being selected.

Also disclosed is a device including a memory cell and a write circuit. The memory cell is configured to store data bits. The write circuit is coupled to the memory cell and configured to program the memory cell. The write circuit includes a write driver and a write waveform generator. The write driver is configured to receive write data and generate a level signal and a selection signal according to the write data. The write waveform generator is coupled with the memory cell. The write waveform generator is configured to select a waveform type between a first waveform type and a second waveform type according to the selection signal, and configured to select a resistance level according to the level signal.

The foregoing outlines features of several embodiments so that those of ordinary skill in the art may better understand aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
applying a read voltage at a first read voltage level to read a memory cell for detecting a resistance level of the memory cell;
applying the read voltage at a second read voltage level, different from the first read voltage level, to read the memory cell for determining a waveform type that has been utilized to program the memory cell; and
recognizing a plurality of data bits stored in the memory cell, wherein the plurality of data bits stored in the memory cell comprise a first data bit and at least one second data bit,
wherein the first data bit is recognized according to the waveform type and is irrelevant with the resistance level, and
the at least one second data bit is recognized according to the resistance level and is irrelevant with the waveform type.

2. The method of claim 1, wherein detecting the resistance level of the memory cell comprises:
measuring a first read current flowing through the memory cell while the read voltage at the first read voltage level is applied to the memory cell; and
determining the resistance level of the memory cell according to the first read current.

3. The method of claim 2, wherein determining the waveform type comprises:
measuring a second read current flowing through the memory cell while the read voltage at the second read voltage level is applied to the memory cell;
comparing the second read current with a reference current;

in response to the second read current being lower than the reference current, determining the waveform type that has been utilized to program the memory cell as a first waveform type; and in response to the second read current exceeding the reference current, determining the waveform type that has been utilized to program the memory cell as a second waveform type different from the first waveform type.

4. The method of claim 3, further comprising:

generating a first programming waveform in the first waveform type comprising a first pulse with a first persisting time duration, when the second read current being lower than the reference current; and generating a second programming waveform in the second waveform type comprising a second pulse with a second persisting time duration, when the second read current exceeding the reference current, wherein the first persisting time duration is different from the second persisting time duration.

5. A method, comprising:

selecting, in response to a selection signal that is associated with write data, a waveform type from a plurality of waveform types;

selecting, in response to a level signal that is associated with the write data, a resistance level from a plurality of resistance levels; and programming data bits into a memory cell according to the waveform type being selected and the resistance level being selected.

6. The method of claim 5, further comprising:

generating a first programming waveform in a first waveform type with a first persisting time duration, when the waveform type being selected is the first waveform type; and generating a second programming waveform in a second waveform type with a second persisting time duration, when the waveform type being selected is the second waveform type different from the first waveform type, wherein the first persisting time duration is different from the second persisting time duration.

7. The method of claim 5, wherein selecting the resistance level and programming the data bits into the memory cell comprises:

selecting a selected resistance level from M resistance levels according to the level signal, wherein M is 2 to a power of N, and N is a positive integer; and programming N+1 data bits into the memory cell according to the waveform type being selected and the resistance level being selected.

8. The method of claim 5, further comprising:

applying a read voltage at a first read voltage level to read the memory cell for verifying the resistance level programmed in the memory cell.

9. The method of claim 5, further comprising:

applying a read voltage at a first read voltage level to read the memory cell for detecting the resistance level of the memory cell;

applying the read voltage at a second read voltage level, different from the first read voltage level, to read the memory cell for determining the waveform type that has been utilized to program the memory cell; and combining the resistance level and the waveform type to recognize a plurality of data bits stored in the memory cell.

10. The method of claim 9, wherein the data bits stored in the memory cell comprises N+1 data bits, N is a positive integer, the method further comprises:

recognizing N data bits of the N+1 data bits according to the resistance level selected from M resistance levels, wherein M is 2 to a power of N; and recognizing one data bit, other than the N data bits, of the N+1 data bits according to the waveform type.

11. A device, comprising:

a memory cell configured to store data bits; and a write circuit coupled to the memory cell and configured to program the memory cell;

wherein the write circuit comprises:

a write driver configured to receive write data and generate a level signal and a selection signal according to the write data; and a write waveform generator coupled with the memory cell, wherein the write waveform generator is configured to select a waveform type between a first waveform type and a second waveform type according to the selection signal, and configured to select a resistance level according to the level signal.

12. The device of claim 11, further comprising:

a read circuit, coupled to the memory cell, the read circuit being configured to:

apply a read voltage at a first read voltage level to read the memory cell for detecting and verifying the resistance level programmed in the memory cell; and apply the read voltage at a second read voltage level, different from the first read voltage level, to read the memory cell for determining the waveform type that has been utilized to program the memory cell.

13. The device of claim 12, wherein the read circuit is further configured to combine the resistance level and the waveform type to recognize the data bits stored in the memory cell.

14. The device of claim 12, wherein the read circuit comprises:

a read voltage generator coupled with the memory cell, and configured to provide the read voltage at the first read voltage level or at the second read voltage level.

15. The device of claim 14, wherein the read circuit further comprises:

a sense amplifier coupled with the memory cell and configured to measure a first read current flowing through the memory cell while the read voltage at the first read voltage level is applied to the memory cell, and configured to determine the resistance level of the memory cell according to the first read current.

16. The device of claim 15, wherein the sense amplifier is further configured to detect a second read current flowing through the memory cell while the read voltage at the second read voltage level is applied to the memory cell, the sense amplifier compares the second read current with a reference current, in response to the second read current being lower than the reference current, the read circuit determines the waveform type that has been utilized to program the memory cell as the first waveform type; and in response to the second read current exceeding the reference current, the read circuit determines the waveform type that has been utilized to program the memory cell as the second waveform type different from the first waveform type.

17. The device of claim 11, wherein the write waveform generator is configured to generate a first programming waveform in the first waveform type with a first persisting time duration, and a second programming waveform in the second waveform type with a second persisting time duration, wherein the first persisting time duration is longer than the second persisting time duration.

18. The device of claim 12, wherein the data bits stored in the memory cell comprises a first data bit and a second data bit,
    the read circuit is configured to recognize the first data bit according to the resistance level selected from two resistance levels, and configured to recognize the second data bit according to the waveform type.

19. The device of claim 12, wherein the data bits stored in the memory cell comprises N+1 data bits, N is a positive integer,
    the read circuit is configured to recognize N data bits of the N+1 data bits according to the resistance level selected from M resistance levels, and
    M is a positive integer and N is 2 to a power of M.

20. The device of claim 11, wherein the write data comprises N+1 data bits, N is a positive integer, and
    the write driver is configured to generate the level signal according to N data bits of the N+1 data bits in the write data, and configured to generate the selection signal according to one data bit, other than the N data bits corresponding to the resistance level, of the N+1 data bits in the write data.

* * * * *